(12) United States Patent
Clevenger et al.

(10) Patent No.: US 11,869,808 B2
(45) Date of Patent: Jan. 9, 2024

(54) TOP VIA PROCESS WITH DAMASCENE METAL

(71) Applicant: International Business Machines Corporation, Armonk, NY (US)

(72) Inventors: Lawrence A. Clevenger, Saratoga Springs, NY (US); Brent Anderson, Jericho, VT (US); Nicholas Anthony Lanzillo, Wynantskill, NY (US); Christopher J. Penny, Saratoga Springs, NY (US); Kisik Choi, Watervliet, NY (US); Robert Robison, Rexford, NY (US)

(73) Assignee: International Business Machines Corporation, Armonk, NY (US)

( * ) Notice: Subject to any disclaimer, the term of this patent is extended or adjusted under 35 U.S.C. 154(b) by 191 days.

(21) Appl. No.: 17/481,362

(22) Filed: Sep. 22, 2021

(65) Prior Publication Data

US 2023/0094757 A1 Mar. 30, 2023

(51) Int. Cl.
*H01L 21/768* (2006.01)
*H01L 23/522* (2006.01)

(52) U.S. Cl.
CPC .... *H01L 21/76897* (2013.01); *H01L 21/7681* (2013.01); *H01L 21/76849* (2013.01); *H01L 21/76861* (2013.01); *H01L 21/76879* (2013.01); *H01L 23/5226* (2013.01); *H01L 21/76816* (2013.01)

(58) Field of Classification Search
CPC .................................. H01L 21/76897
See application file for complete search history.

(56) References Cited

U.S. PATENT DOCUMENTS

| | | |
|---|---|---|
| 5,693,568 A | 12/1997 | Liu |
| 6,245,669 B1 | 6/2001 | Fu |
| 6,291,334 B1 | 9/2001 | Somekh |
| 6,424,044 B1 | 7/2002 | Han |
| 7,550,822 B2 | 6/2009 | Lee |
| 8,062,971 B2 | 11/2011 | Riess |
| 8,299,625 B2 | 10/2012 | Ponoth |
| 8,611,055 B1 | 12/2013 | Pakala |
| 9,613,861 B2 | 4/2017 | Anderson |
| 10,032,643 B2 | 7/2018 | Chawla |
| 2016/0049364 A1* | 2/2016 | Edelstein .......... H01L 21/76834 257/774 |
| 2019/0088543 A1* | 3/2019 | Lin .................... H01L 21/31116 |

(Continued)

*Primary Examiner* — Erik Kielin
(74) *Attorney, Agent, or Firm* — Edward J. Wixted, III

(57) ABSTRACT

An approach providing a semiconductor wiring structure with a self-aligned top via on a first metal line and under a second metal line. The semiconductor wiring structure includes a plurality of first metal lines in a bottom portion of a first dielectric material. The semiconductor wiring structure includes a top via in a top portion of the first dielectric material, where the top via is over a first metal line of the plurality of first metal lines. The semiconductor wiring structure includes a second dielectric material above each of the plurality of first metal lines except the first metal line of the plurality of first metal lines. Furthermore, the semiconductor wiring structure includes a second metal line above the top via, wherein the second metal line is in a third dielectric material and a hardmask layer that is under the third dielectric material.

6 Claims, 4 Drawing Sheets

(56) References Cited

U.S. PATENT DOCUMENTS

| | | | |
|---|---|---|---|
| 2019/0363048 A1* | 11/2019 | Zhao | H01L 23/5226 |
| 2019/0371657 A1* | 12/2019 | Chandhok | H01L 21/76856 |
| 2021/0305090 A1* | 9/2021 | Cheng | H01L 21/76813 |
| 2021/0343585 A1* | 11/2021 | Anderson | H10N 70/066 |
| 2023/0014156 A1* | 1/2023 | Su | H01L 21/76807 |

* cited by examiner

TOP VIA PROCESS WITH DAMASCENE METAL

BACKGROUND OF THE INVENTION

The present invention relates generally to the field of semiconductor technology and more particularly to forming a semiconductor wiring structure where a top via and a line above the top via are formed with the same metal deposition process and the top via shares at least a portion of a sidewall with a line under the top via.

Traditionally, semiconductor interconnects such as horizontal interconnects including lines and power planes, and vertical interconnect access, more commonly known as vias, have been formed in semiconductor devices. The formation of high-quality interconnects is a critical part of ultra-large-scale integration (ULSI) integrated circuits. In a conventional fabrication process, vias and upper wiring structures are formed in a dual damascene process. In this type of process, the via openings and trenches are formed in a dielectric layer prior to the deposition of metal materials. In dual damascene processes, the via openings typically have a tapered edge with a smaller cross-sectional area (width) at the bottom of the opening than at a top of the opening. The metal material is deposited over the dielectric layer and in via openings the trenches. A planarization process removes excess metal material on the dielectric layer to form one or more vias or one or more interconnect lines. Typically, a low resistivity metal, such as copper is used to form both the interconnect lines and the vias in the metal layers of a semiconductor device.

SUMMARY

Embodiments of the present invention provide a semiconductor wiring structure with a self-aligned top via on a first metal line and under a second metal line. The semiconductor wiring structure includes a plurality of first metal lines in a bottom portion of a first dielectric material. The semiconductor wiring structure includes a top via in a top portion of the first dielectric material, where the top via is over a first metal line of the plurality of first metal lines. The semiconductor wiring structure includes a second dielectric material above each of the plurality of first metal lines except the first metal line of the plurality of first metal lines. Furthermore, the semiconductor wiring structure includes a second metal line above the top via, wherein the second metal line is in a third dielectric material and a hardmask layer that is under the third dielectric material.

Embodiments of the present invention provide a method of forming a back end of line semiconductor wiring structure, the method includes forming a plurality of first metal lines in a first dielectric material using a damascene process and recessing the plurality of metal lines using a wet etching process. The method includes depositing a second dielectric material above the plurality of first metal lines and selectively removing a portion of the second dielectric material above at least one line of the plurality of first metal lines. The method includes depositing an etch stop material over exposed surfaces of the first dielectric material, the second dielectric material, and the at least one line of the plurality of first metal lines. Furthermore, the method includes depositing a third dielectric material over the etch stop material and selectively removing a portion of the third dielectric material above the at least one line of the plurality of first metal lines. The method includes selectively removing a portion of the etch stop material above the at least one line of the plurality of first metal lines and depositing a second metal material over exposed surfaces of the first dielectric material, the second dielectric material, and the at least one line of the plurality of first metal lines.

BRIEF DESCRIPTION OF THE DRAWINGS

The above and other aspects, features, and advantages of various embodiments of the present invention will be more apparent from the following descriptions taken in conjunction with the accompanying drawings.

DETAILED DESCRIPTION

Figure 1:
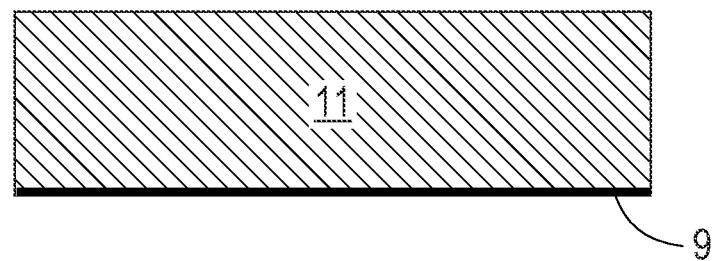
FIG. 1 is a top view of a portion of a semiconductor structure with a layer of a first etch stop and a first layer of an interlayer dielectric (ILD), in accordance with an embodiment of the present invention.

Embodiments of the present invention recognize that forming copper lines and vias for semiconductor interconnects using damascene metallization processes is conventional in the backend of the line (BEOL) metal layers. The damascene metallization processes typically include patterning and selectively etching a dielectric material and depositing a layer of copper in the etched holes or trenches to form vias, lines, and power planes followed by a planarization of the top surface of the semiconductor structure to remove excess copper.

Embodiments of the present invention recognize that fabricating vias with small dimensions that are ten nanometers or less is difficult due to the placement of the via below the trench that forms the line. As line pitches continue to decrease, the ability to align a via to a specific trench is beyond current tooling capabilities. Additionally, embodiments of the present invention recognize that resistive-capacitive (RC) delay is a major problem in achieving desired device electrical performance caused by high capacitance and high resistance of narrow pitch interconnects. Embodiments of the present invention recognize that misalignment of vias and more specifically, misalignment of top vias formed on a BEOL metal lines with small dimensions (e.g., ten nanometers or less) causes a significant via resistance penalty in the BEOL interconnect wiring electrical performance. The larger the misalignment between the top via and the metal line it resides on, the larger the resistance penalty.

Embodiments of the present invention provide a method of forming a semiconductor structure that provides a top via that is self-aligned to a metal line below the top via. The top via is formed above a metal line that is recessed after planarizing the metal line excess metal and in this way, the top via is directly aligned within the interlayer dielectric trench that is used to form the recessed line and the top via will have a diameter that is the same as the diameter or width of the line under the top via. Embodiments of the present invention provide a method of forming a self-aligned top via that reduces the electrical resistance generated by misaligned top vias and the metal line the top vias reside on. Using self-aligned top via formation processes improves the electrical performance of the BEOL interconnect wiring as the self-aligned top via there is less misalignment causing a reduced conduction area between the top via and the metal line it resides on.

Embodiments of the present invention provide a method to form a top via that is being formed with the same metal deposition into the top via opening and into the trench above the top via opening. In this way, after planarization, the line and the top via under the line can be formed using a reduced number of process steps (e.g., top via planarization is not needed and an additional dielectric layer deposition and patterning is not required). Embodiments of the present invention provide the method of forming the top via where an additional etch process is not needed to etch the top via at the bottom of a metal etched line as the top via is formed in the same trench that creates the metal line upon which the top via will reside.

Embodiments of the present invention provide a method that includes using conventional damascene processes to form trenches in a first dielectric layer above a hardmask as an etch stop layer in a wiring structure then, removing the hardmask in the trenches, depositing a metal layer, and planarizing the wiring structure to form a number of lines. The method includes recessing the metal lines below the top surface of the remaining dielectric layer and depositing a second dielectric material with a different composition and etch selectivity. The method includes removing a portion of the second dielectric material that is above at least one of the recessed metal lines to form the top via opening.

The method includes depositing a conformal hardmask as an etch stop over the exposed surfaces of the top via opening, first and second dielectric layers. A third dielectric material with a different composition and etch selectivity of the second dielectric material is deposited over the hardmask. The third dielectric material is patterned and selectively etched to form a trench over the top via opening. The hardmask is removed from the top via opening and exposed portions of the first dielectric material. The hardmask removal from the top via opening exposes a portion of the metal line below the top via opening. Embodiments of the present invention provide a method of forming the top via by growth or deposition of the top via metal on the exposed metal line above the top view or by forming the top via and the line above the top via in a single metal deposition process. After performing a planarization process, the top via is formed on the exposed portions of the line below the top via and is formed in the same metallization process as the line above the top via.

Embodiments of the present invention provide a self-aligned top via where the width of the top via formed in a portion of the trench creating the line below the top via has the same width as the line below the top via. The top via and the line below the top via have at least two of the same vertical planes (i.e., the top via and the line below are formed in the same trench).

Embodiments of the present invention include a second dielectric material with a different composition and etch selectivity that is above each of the lines formed in the first dielectric material except the line with the top via above it.

Embodiments of the present invention include a line in a second metal layer above the top via. The line is formed in a third dielectric material. The third dielectric material is over a portion of a hardmask layer that covers the second dielectric material and the remaining portions of the first dielectric material that are not under the line in the second metal layer.

Detailed embodiments of the claimed structures and methods are disclosed herein. The method steps described below do not form a complete process flow for manufacturing integrated circuits, such as semiconductor devices. The present embodiments can be practiced in conjunction with the integrated circuit fabrication techniques currently used in the art, for advanced semiconductor devices, and only so much of the commonly practiced process steps are included as are necessary for an understanding of the described embodiments. The figures represent cross-section portions of a portion of an advanced semiconductor device after fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment," "an embodiment," etc., indicate that the embodiment described may include a particular feature, structure, or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top", "bottom," and derivatives thereof shall relate to the disclosed structures and methods, as oriented in the drawing figures. The terms "overlying," "atop," "over," "on "positioned on," or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps, materials, or operations that are known in the art may have been combined for presentation and illustration purposes and in some instances may not have been described in detail. Additionally, for brevity and maintaining a focus on distinctive features of elements of the present invention, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention.

FIG. 1 is a top view of a portion of a semiconductor structure with first etch stop 9 and ILD 11 over etch stop 9, in accordance with an embodiment of the present invention. Etch stop 9 resides a portion of a back end of the line (BEOL) or a middle of the (MOL) line interconnect wiring layer (not depicted). The BEOL or MOL interconnect layer can be composed of a layer of interlayer dielectric material and/or one or more vias or metal lines. In various embodiments, etch stop 9 is on an ILD layer (not depicted). Etch stop 9 is a layer of a dielectric material, such as SiN, AlN, or any other nitride or oxide material used as a hardmask material for an etch stop in the BEOL semiconductor processes. ILD 11 can be $SiO_2$, octamethylcyclotetrasiloxane (i.e., $[(CH_3)_2SiO]_4$), or any other suitable dielectric material used as an interlayer dielectric in BEOL semiconductor manufacturing processes. A thickness of ILD 11 can be in the range of 5 to 25 nm but is not limited to these thicknesses. An optional chemical mechanical polish (CMP) may planarize the top surface of ILD 11.

Figure 2:
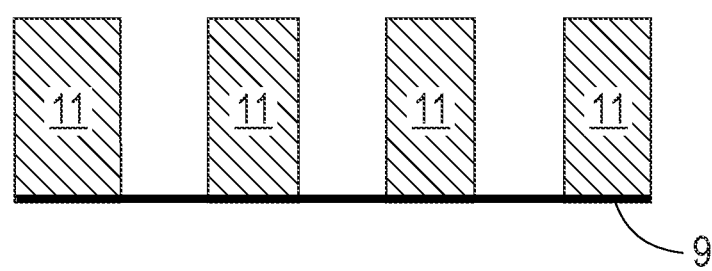
FIG. 2 is a cross-sectional view of a portion of the semiconductor structure after selectively removing portions of the first ILD, in accordance with an embodiment of the present invention.

FIG. 2 is a cross-sectional view of a portion of the semiconductor structure after selectively removing portions of ILD 11, in accordance with an embodiment of the present invention. Using known lithography for patterning ILD 11 and removing exposed portions of ILD 11 using known etching processes, such as reactive ion etch or a wet chemical etch process. After etching, a number trenches in ILD 11 are formed that expose portions of etch stop 9.

Figure 3:
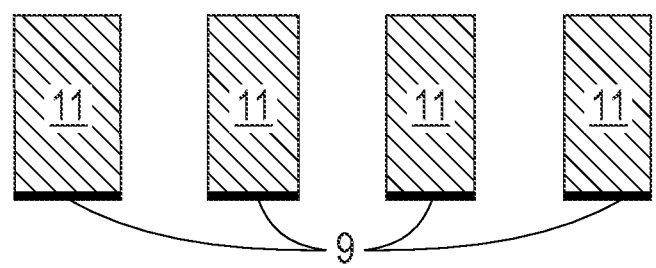
FIG. 3 is a cross-sectional view of a portion of the semiconductor structure after removing exposed portions of the first etch stop material, in accordance with an embodiment of the present invention.

FIG. 3 is a cross-sectional view of a portion of the semiconductor structure after removing exposed portions of etch stop 9, in accordance with an embodiment of the present invention. Using one or more known wet chemical etching processes or a dry etching process (e.g., RIE), the exposed portions of etch stop 9 can be removed. As depicted, FIG. 3 includes the remaining portions of ILD 11 on the remaining portions of etch stop 9. The space between each adjacent the remaining portions of ILD 11 can be approximately one-half the interconnect pitch (e.g., the pitch between adjacent features, such as lines in the BEOL or MOL interconnect wiring level). For example, if the interconnect pitch is 30 nm or less, then the space between adjacent portions of ILD 11 would be in the range of 5 to 20 nm but is not limited to this range. As known to one skilled in the art, the distance between adjacent remaining portions of ILD 11 can vary depending on the BEOL interconnect layer etch stop 9 resides on and as the BEOL interconnect layer etch stop 9 resides on increases, accordingly the space between adjacent remaining portions of ILD 11 on etch stop 9 can increase.

Figure 4:
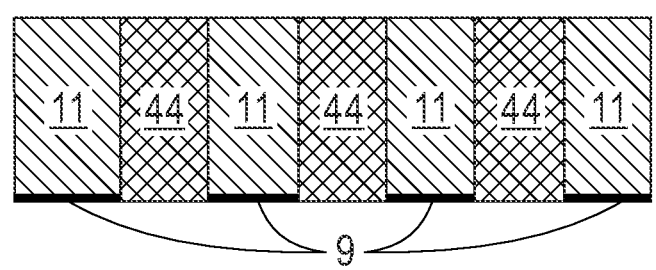
FIG. 4 is a cross-sectional view of a portion of the semiconductor structure after depositing and planarizing a layer of a metal material, in accordance with an embodiment of the present invention.

FIG. 4 is a cross-sectional view of a portion of the semiconductor structure after depositing and planarizing a layer of metal 44, in accordance with an embodiment of the present invention. A layer of a BEOL metal material, such as copper, cobalt, tungsten, ruthenium, etc. Metal 44 can be deposited over ILD 11 and in the trenches formed when portions of ILD 11 and etch stop 9 are removed from a top surface of the BEOL interconnect wiring layer (not depicted in FIG. 4). In some embodiments, the exposed surfaces of ILD 11 are deposited or seeded with a thin layer (e.g., 1 to 2 nm) of a metal material. The metal material for the seed layer can be a different metal material than metal 44. For example, the seed layer can be one or more of titanium (Ti), titanium nickel (TiN), tantalum (Ta), TaN, or another seed metal). The seed metal may be deposited by one of a physical vapor deposition (PVD), atomic layer deposition (ALD), or another known seed layer deposition process before depositing metal 44. In various embodiments, metal 44 can be deposited using an electroplating process. In some embodiments, a liner is deposited, for example by ALD, PVD, or plasma-enhanced CVD, under metal 44. Typical liner materials include Ti, TiN, Ta, and TaN but are limited to these materials. A layer of metal 44 can be deposited over the semiconductor structure by electroplating. After metal 44 is deposited over ILD 11 and exposed portions of BEOL interconnect layer that was under the removed portions of etch stop 9. A CMP can be performed to planarize the top surface of the semiconductor structure. After the CMP, the top surfaces of the remaining portions of ILD 11 and metal 44 are level.

Figure 5:
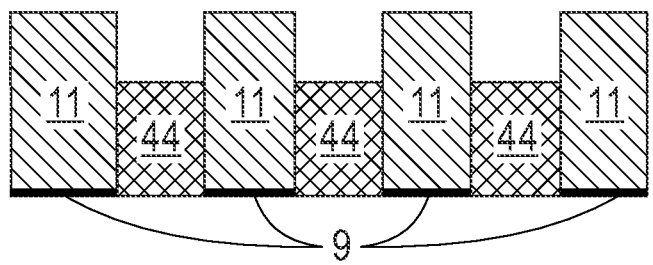
FIG. 5 is a cross-sectional view of a portion of the semiconductor structure after recessing the deposited metal material, in accordance with an embodiment of the present invention.

FIG. 5 is a cross-sectional view of a portion of the semiconductor structure after recessing metal 44, in accordance with an embodiment of the present invention. For example, a wet chemical etch process can be used to selectively remove the top portion of metal 44 between the remaining portions of ILD 11. The wet chemical etch process may remove 15% to 40% of metal 44 but is not limited to these amounts. The etching process recesses the remaining portions of metal 44 between the remaining ILD 11 (e.g., the top surface of metal 44 is below the top surface of ILD 11).

Figure 13:
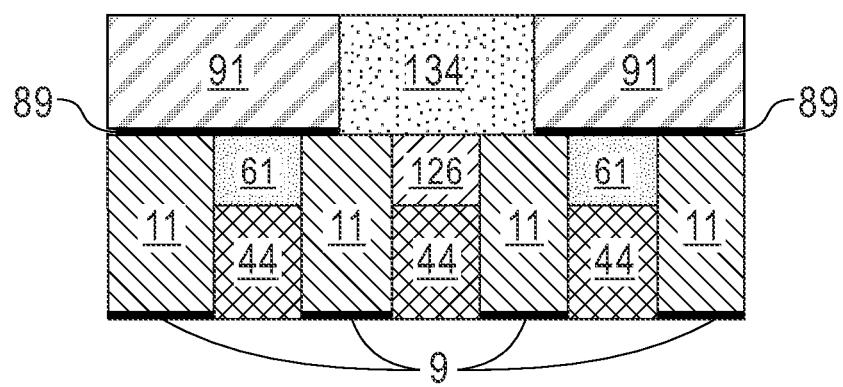
FIG. 13 is a cross-sectional view of a portion of the semiconductor structure after depositing a third metal layer over exposed surfaces of the first ILD and the second metal layer grown above the recessed, deposited first metal layer and planarizing the third metal layer, in accordance with an embodiment of the present invention.
Figure 14:
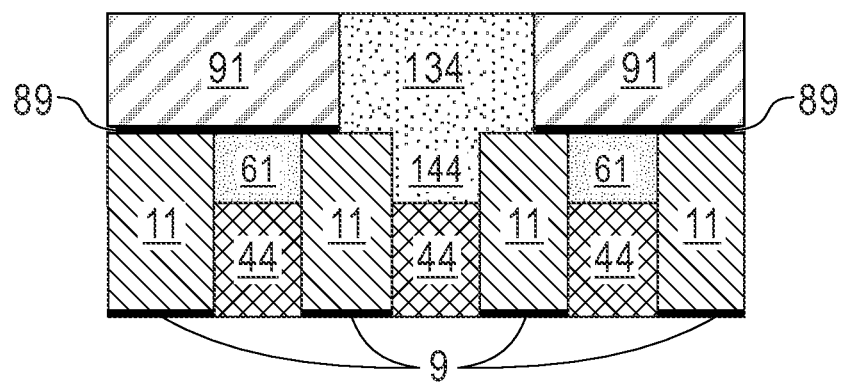
FIG. 14 is a cross-sectional view of a portion of the semiconductor structure after depositing the third metal layer on the recessed, deposited first metal layer and over the exposed portions of the first ILD and the second ILD of the semiconductor structure depicted in FIG. 11, in accordance with an embodiment of the present invention.

One or more of the recessed areas above the remaining metal 44 can be the top via opening for the top via formed later as depicted in FIG. 13 and FIG. 14. The top via opening formed by metal 44 recessing is formed, at least in part, in the same trench as the line formed with metal 44. The vertical sides of ILD 11 exposed after the recessing of metal 44 will form the sidewalls of the top via depicted later in FIG. 13 and FIG. 14.

Figure 6:
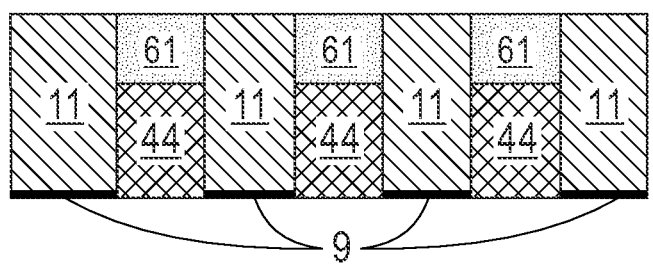
FIG. 6 is a cross-sectional view of a portion of the semiconductor structure after depositing a second ILD and planarizing the second ILD, in accordance with an embodiment of the present invention.

FIG. 6 is a cross-sectional view of a portion of the semiconductor structure after depositing ILD 61 and planarizing ILD 61, in accordance with an embodiment of the present invention. ILD 61 may be deposited over exposed surfaces of ILD 11 and recessed metal 44 using known ILD deposition processes, such as PVD, CVD, etc. ILD 61 is composed of a different ILD material than ILD 11. The material used for ILD 61 provides a different etch selectivity than the material used for ILD 11. For example, ILD 61 can be SiN, SiCN, or another nitride based ILD material but is not limited to these ILD materials. The ILD material selected for ILD 61 should have a different composition and a different (e.g., faster) etch rate than the material selected for ILD 11 which is typically an oxide based ILD material in various embodiments of the present invention.

After depositing the layer of ILD 61 over the semiconductor structure, a CMP is performed to planarize the top surface of ILD 61 so that the top surface of ILD 61 and the top surface of ILD 11 are level or have the same height as depicted in FIG. 6.

Figure 7:
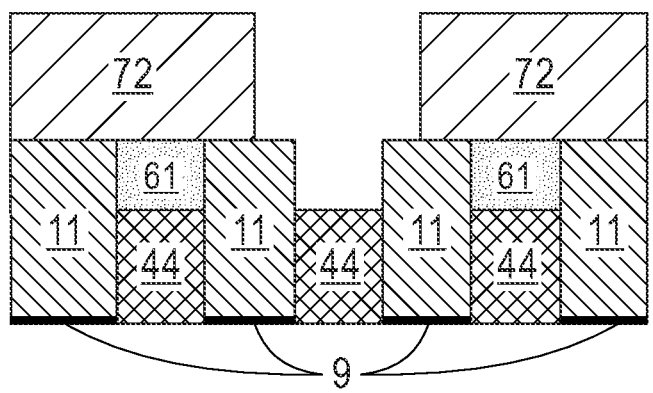
FIG. 7 is a cross-sectional view of a portion of the semiconductor structure after depositing and patterning a mask material to remove a portion of the second ILD, in accordance with an embodiment of the present invention.

FIG. 7 is a cross-sectional view of a portion of the semiconductor structure after depositing and patterning mask 72 to remove a portion of ILD 61, in accordance with an embodiment of the present invention. The mask material for mask 72 can be one of a hardmask material, such as an inorganic silicon-based photoresist material, a metal oxide material, or another suitable material capable of patterning, for example with lithography. As depicted in FIG. 7, a portion of mask 72 is patterned and removed to expose one portion of ILD 61 and a top portion of ILD 11 in two adjacent remaining portions of ILD 11.

After patterning mask 72, the exposed portion of ILD 61 can be removed using one of a wet etch process or a dry etch process (e.g., RIE). After removing the exposed portion of ILD 61, a via hole can be formed above metal 44. The via hole is between the remaining portion of ILD 11 above metal 44.

Figure 8:
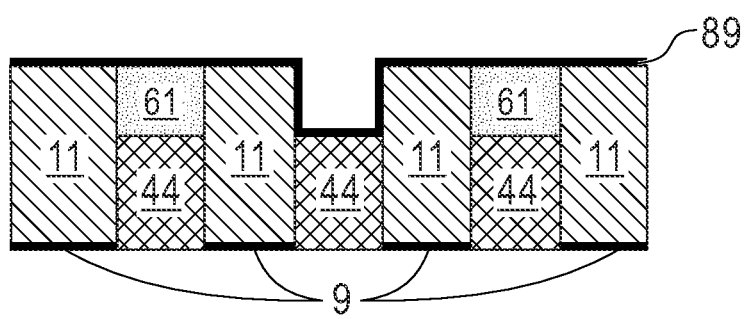
FIG. 8 is a cross-sectional view of a portion of the semiconductor structure after removing the mask and depositing a second etch stop layer to the exposed surfaces of the semiconductor structure, in accordance with an embodiment of the present invention.

FIG. 8 is a cross-sectional view of a portion of the semiconductor structure after removing mask 72 and depositing etch stop 89 to the exposed surfaces of ILD 11, ILD 61, and metal 44, in accordance with an embodiment of the present invention. In various embodiments, etch stop 89 is composed of a hardmask material. As depicted, FIG. 8 includes etch stop 89, ILD 11, ILD 61, etch stop 9, and metal 44 where etch stop 9 and metal 44 are over a BEOL interconnect layer (not depicted). Using known deposition processes, such as PVD or CVP for an etch stop layer composed of an etch stop material such as a nitride (e.g., SiN, AlN) material or an oxide material (e.g., $SiO_2$, etc.) can be deposited over exposed surfaces of ILD 11, ILD 61, and metal 44 as depicted in FIG. 8. Etch stop 89 is deposited after creating the via hole between adjacent remaining portions of ILD 11 and over the exposed portion of metal 44. As depicted in FIG. 8, etch stop 89 is conformally deposited in the via hole exposing a portion of metal 44 and over the exposed surfaces of ILD 11 and ILD 61.

Figure 9:
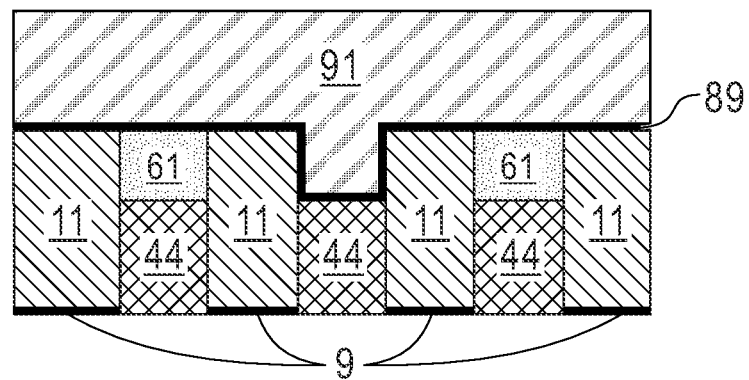
FIG. 9 is a cross-sectional of a portion of the semiconductor structure after depositing a third ILD over the semiconductor structure, in accordance with an embodiment of the present invention.

FIG. 9 is a cross-sectional view of a portion of the semiconductor structure after depositing ILD 91 over the semiconductor structure, in accordance with an embodiment of the present invention. As depicted, ILD 91 is deposited by known deposition methods, such as PVD, CVD, etc. over etch stop 89. ILD 91 can be the same material as ILD 11. In some embodiments, ILD 91 is composed of a different ILD material. ILD 91 can be any ILD material.

Figure 10:
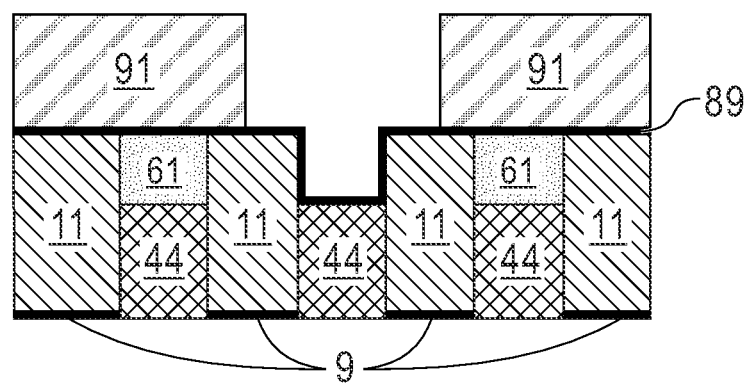
FIG. 10 is a cross-sectional view of a portion of the semiconductor structure after selectively removing a portion of the third ILD, in accordance with an embodiment of the present invention.

FIG. 10 is a cross-sectional view of a portion of the semiconductor structure after selectively removing a portion of ILD 91, in accordance with an embodiment of the present invention. ILD 91 can be patterned using lithography and removed using a dry etch process, such as RIE. The portion of ILD 91 above etch stop 89 removed can be self-aligned and centered over the via hole previously formed between two adjacent portions of ILD 11. The self-aligned via hole and the trench formed above an exposed portion of etch stop 89 that is above a portion of metal 44 are lined and protected during the etching process by etch stop 89. The portion of ILD 91 opens up to form a trench directly over the via hole in ILD 11 that is covered by etch stop 89. The trench formed during the selective etching of ILD 91 has a width suitable for forming a line in the next BEOL metal layer deposited later as depicted in FIG. 13. For example, the width of the trench formed in ILD 91 can be approximately one-half of the interconnect pitch. For example, the interconnect pitch could be 30 nm or less and the trench width can be 5 to 20 nm but is not limited to these widths. The width of the trench in ILD 91 may vary depending on the BEOL or MOL metal layer (e.g., M1, M2, etc.) that metal 44 resides in. The higher the metal layer (e.g., M3 vs. M1) the wider the width of the trench over the via hole. Upon completing the selective etch of ILD 91, the trench depth is controlled by etch stop 89 and can have uniform depth (e.g., ILD 11 is protected by etch stop 89 during the selective etching of ILD 91 to provide a uniform depth for the trench). Using the selective etch process and etch stop 89, the via hole is opened without performing additional patterning and etching processes.

Figure 11:
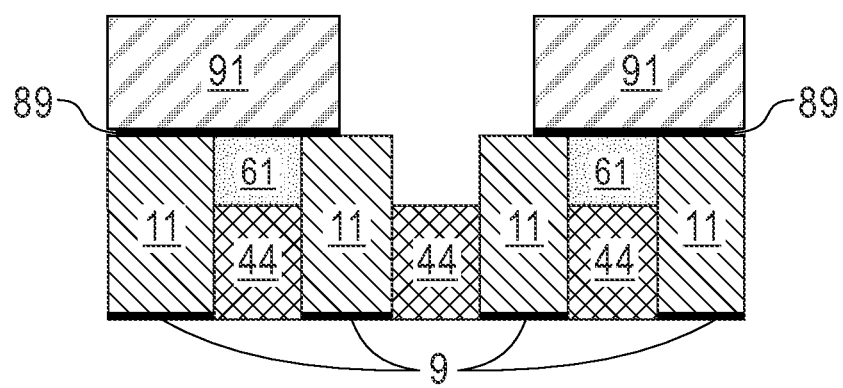
FIG. 11 is a cross-sectional view of a portion of the semiconductor structure after removing exposed portions of the second etch stop layer, in accordance with an embodiment of the present invention.

FIG. 11 is a cross-section of a portion of the semiconductor structure after removing exposed portions of etch stop 89, in accordance with an embodiment of the present invention. Using one of a wet chemical etch process or a dry etch process (e.g., RIE), the portions of etch stop 89 not covered by ILD 91 are removed over the via hole formed between two of the adjacent remaining portions of ILD 11 and etch stop 89 is removed over the outer top edge portions of the two adjacent remaining portions of ILD 11 around the via hole. After removing exposed portions of etch stop 89, metal 44 is exposed in the bottom of the via hole. The top outer portions of the two adjacent portions of ILD 11 around the via hole can be exposed after removing etch stop 89. After removing the portions of etch stop 89 not under ILD 91, etch stop 89 remains over ILD 61, and the remaining portions of ILD 11 that is not directly adjacent to the via hole.

Figure 12:
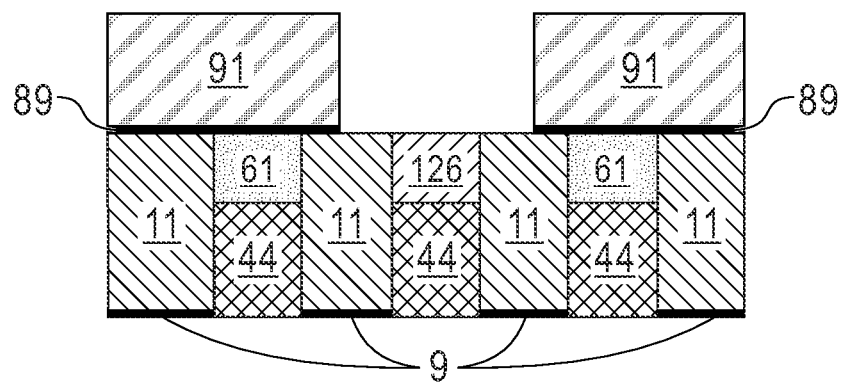
FIG. 12 is a cross-sectional view of a portion of the semiconductor structure after growing a second metal layer on the exposed surface of the recessed, deposited first metal layer, in accordance with an embodiment of the present invention.

FIG. 12 is a cross-sectional view of a portion of the semiconductor structure after depositing metal layer 126 on the exposed surface of metal 44, in accordance with an embodiment of the present invention. In various embodiments, metal layer 126 is deposited or selectively grown on metal 44 using use either ALD or CVD. In these embodiments, commonly grown selective metals for metal layer 126 include cobalt (Co), tungsten (W), and ruthenium (Ru) but could be another BEOL interconnect metal. The selective growth of metal layer 126 occurs on the top surface of exposed and recessed portions of metal 44 in the via hole (i.e., as previously discussed with reference to FIG. 7). In some embodiments, the selective growth of metal layer 126 is a deposition process. For example, the deposition process may use electroplating or a reflow process that is followed by a wet chemical etching process to get remove excess metal layer 126 from all exposed surfaces except for in the via hole. The reflow process, as known to one skilled in the art, includes the deposition of a thin layer of metal, such as metal layer 126 for example, using PVD. After the deposition, metal layer 126 is heated to increase the temperature to approximately the melting point of metal layer 126 causing metal layer 126 to 'flow' and fill the via hole opening. In this case, the reflowed metal fills the via hole and forms the top via above metal 44. In these embodiments, a second metal deposition of metal layer 134, for example, using electroplating with another metal fills the trench in ILD 91 forms the metal line(s) over the top via. In these embodiments, the top via formed is formed with metal layer 126 in a first deposition or reflow process, and the metal lines above the top via are formed using a second deposition process, such as electroplating. In some embodiments, metal layer 126 and metal layer 134 are composed of different metal materials.

In some embodiments, a liner (not depicted in FIG. 12) is deposited before metal layer 126 is formed. In various embodiments, metal layer 126 forms a via or a top via above metal 44. In other words, metal layer 126 forms a top via above a BEOL line formed by metal 44. After deposition of metal layer 126, the top surface of metal layer 126 is approximately level or even with the top surfaces of ILD 11. The vertical sidewalls of ILD 11 are share metal layer 126 and metal 44 share the sidewall of two adjacent remaining portions of ILD 11 as depicted in FIG. 12. After a CMP removes the excess metal layer 134, metal layer 134 forms the line over the top via created by metal layer 126. The portion of metal 44 remaining under metal layer 126 is one of the lines in a metal layer where each of the remaining portions of metal 44 is a line. The lines that are not under a top via formed by metal layer 126 are covered by ILD 61 and surrounded by ILD 11. The portions of metal layer 134, as depicted in FIG. 12, are above the top via formed by metal layer 126. A bottom surface of metal layer 134 abuts or contacts a vertical edge of etch stop 89. As known to one skilled in the art, various other portions of metal layer 134 in ILD 91 (not depicted) can also form metal lines in the BEOL interconnect wiring layer that is above the metal layer created by metal 44.

FIG. 13 is a cross-sectional view of a portion of the semiconductor structure after depositing metal layer 134 over exposed surfaces of metal layer 126, etch stop 89, and ILD 91 and planarizing metal layer 134, in accordance with an embodiment of the present invention. Metal layer 134 can be one of copper, tungsten, cobalt, ruthenium, or any other suitable BEOL conductive material used in semiconductor fabrication processes. Metal layer 134 may be composed of the same BEOL material as metal 44 or metal layer 126 or metal layer 134 may be composed of a different BEOL material. In various embodiments, metal layer 134 fills the trench formed in ILD 91 and is above metal layer 126 and exposed portions of ILD 11 adjacent to metal layer 126 and below the trench. After depositing metal layer 134 in the trench, a CMP can be performed to planarize the top surfaces of metal layer 134 and ILD 91. After the CMP, the top surfaces of ILD 91 and metal layer 134 are level. After completing the CMP, metal layer 134 is a line over a top via on metal 44. The thickness and width of the remaining portion of metal layer 134 are consistent with the metal layer of the BEOL or MOL interconnect wiring. For example, if metal 44 is a part of the M1 metal layer, then, metal layer 134 is a part of the M2 metal layer and would have dimensions consistent with the M2 metal layer wires. As known to one skilled in the art, as the metal layers increase, the dimensions of the features of the BEOL interconnect wiring also increase. For example, the feature dimensions such as the line width and line spacing of metal layer 134 after completing planarization to form lines may be approximately 1.2 to 2 times larger than the same features (e.g., line width and line spacing) in the same features in metal 44.

As depicted in FIG. 12, after completing the CMP to form a line from metal layer 134, portions of etch stop 89 remain under the remaining portions of ILD 91, and each of the remaining portions of ILD 61 is under a portion of etch stop 89. Using ILD 61 with a different composition and etch selectivity than ILD 11 and ILD 91 allows the self-aligned formation of a top via formed with metal layer 126 on the line formed from metal 44. Depositing ILD 61 on the recessed portions of metal 44 as depicted in FIG. 6, and then, selectively etching ILD 61 (e.g., due to the different composition and etch selectivity of ILD 61 compared ILD 11) while maintaining the portions of ILD 11, provides a method of opening up the via hole. The via hole is then protected by deposited etch stop 89 as depicted in FIGS. 8-10 and allows the via hole to be formed without additional patterning steps. Using etch stop 89 to protect portions of ILD 11 during the selective etching of ILD 91 and provides a uniform trench depth as depicted in FIG. 10 and FIG. 11.

As depicted, FIG. 13 includes lines formed with metal 44 on a MOL or BEOL interconnect layer, where metal 44 is recessed to deposit ILD 61 that has a different etch selectivity and composition than ILD 11 in each of the recesses. FIG. 13 includes a top via formed with metal layer 126 where the top via is formed by selectively etching one portion of ILD 61 on recessed metal 44 and then, depositing etch stop 89 and ILD 91 over etch stop 89. After patterning and selectively removing a portion of IL D over the via hole and then, removing exposed portions of etch stop 89, the top via can be formed by BEOL metal deposition in the via hole on metal 44, and a line can be formed on the top via (e.g., metal layer 126) with metal 134. The top via is in the top or upper portion of ILD 11 over metal 44 and the line formed with metal layer 134 in ILD 91. After forming the line with metal layer 134 above the top via composed of metal layer 126, etch stop 89 remains under ILD 91 and etch stop 9 remains under ILD 11.

FIG. 14 is a cross-sectional view of a portion of the semiconductor structure after depositing metal layer 144 on metal 44 and over the exposed portions of ILD 11 and ILD 91 of the semiconductor structure depicted in FIG. 11, in accordance with a second embodiment of the present invention. In this embodiment, after selectively removing portions of ILD 91 as discussed in detail with respect to FIG. 11, instead of depositing or growing metal layer 126 for the top via, metal layer 144 is deposited in the via hole, filling the trench, and is over ILD 91. Metal layer 144 can be composed of any known MOL or BEOL conductive material or metal for forming a metal layer. A CMP is performed to remove the overburden or excess metal of metal layer 144 above ILD 91 to form a line in the trench that was formed in ILD 91 as depicted in FIG. 10 and to form a top via with metal layer 144 that is above metal 44 and below the line formed in the trench.

As depicted, the resulting semiconductor structure of FIG. 14 is the same as the semiconductor structure of FIG. 13 except that metal layer 126 is not present. In this embodiment, metal layer 144 forms the top via over metal 44.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The methods described herein can be used in the fabrication of integrated circuit chips or semiconductor chips. The resulting semiconductor chips can be distributed by the fabricator in raw wafer form (that is, as a single wafer that has multiple unpackaged chips), as a bare die, or in a packaged form. In the latter case, the semiconductor chip is mounted in a single chip package (such as a plastic carrier, with leads that are affixed to a motherboard or other higher-level carrier) or in a multichip package (such as a ceramic carrier that has either or both of surface interconnections or buried interconnections). In any case, the semiconductor chip is then integrated with other semiconductor chips, discrete circuit elements, and/or other signal processing devices as part of either (a) an intermediate product, such as a motherboard, or (b) an end product. The end product can be any product that includes semiconductor chips, ranging from toys and other low-end applications to advanced computer products having a display, memory, a keyboard or other input device, and a central processor.

What is claimed is:

1. A method of forming a back end of line semiconductor wiring structure, the method comprising:
   forming a plurality of first metal lines in a first dielectric material using a dual damascene process;
   recessing the plurality of metal lines using a wet etching process;
   depositing a second dielectric material above the plurality of first metal lines;
   selectively removing a portion of the second dielectric material above at least one line of the plurality of first metal lines;
   depositing an etch stop material over exposed surfaces of the first dielectric material, the second dielectric material, and the at least one line of the plurality of first metal lines;
   depositing a third dielectric material over the etch stop material;
   selectively removing a portion of the third dielectric material above the at least one line of the plurality of first metal lines;
   selectively removing a portion of the etch stop material above the at least one line of the plurality of first metal lines; and
   depositing a second metal material over the exposed surfaces of the first dielectric material, the second dielectric material, and the at least one line of the plurality of first metal lines.

2. The method of claim 1, further comprises performing a chemical mechanical polish to remove excess portions of the second metal material to form one or more second metal lines, wherein at least one second line of the one of more second lines is above a top via composed of the second metal material on the at least one line of the plurality of first metal lines.

3. The method of claim 1, wherein the depositing the second metal material over the exposed surfaces of the first dielectric material, the second dielectric material, and the at least one line of the plurality of first metal lines further comprises:
   depositing the second metal material over the at least one line of the plurality of first metal lines in the first dielectric material using one of an electroplating process or a reflow process.

4. The method of claim 3, wherein the depositing the second material uses the reflow process, further comprises:
   depositing the second metal material using a physical vapor deposition;
   heating the second metal material to melt and reflow the second metal material; and
   depositing another layer of the first metal material that is different than the second metal material using electroplating over the second metal material, over exposed surfaces of the first dielectric material, and the third dielectric material.

5. The method of claim 1, wherein the depositing the second metal material over the exposed surfaces of the first dielectric material, the second dielectric material, and the at least one line of the plurality of first metal lines further comprises:
   using self-aligning processes to form a top via composed of the second metal material above the at least one line of the plurality of first metal lines and to form a second metal line over a top via, wherein the second metal line composed of the second metal material is formed after removing excess portions of the second metal material over the third dielectric material.

6. The method of claim 1, wherein the selectively removing the portion of the etch stop material above the at least one line of the plurality of first metal lines, further comprises:
   one or more portions of the etch stop material remain under remaining portions of the third dielectric material; and
   one or more portions of the second dielectric material remain under the one or more portions of the etch stop material that remains after the selectively removing of the portion of the etch stop material.

* * * * *